US011229151B2

United States Patent
Ishikawa et al.

(10) Patent No.: US 11,229,151 B2
(45) Date of Patent: Jan. 18, 2022

(54) COMPONENT MOUNTING MACHINE

(71) Applicant: FUJI CORPORATION, Chiryu (JP)

(72) Inventors: Kenzo Ishikawa, Kariya (JP); Jun Iisaka, Nisshin (JP); Hidetoshi Ito, Okazaki (JP)

(73) Assignee: FUJI CORPORATION, Chiryu (JP)

( * ) Notice: Subject to any disclaimer, the term of this patent is extended or adjusted under 35 U.S.C. 154(b) by 197 days.

(21) Appl. No.: 16/497,664

(22) PCT Filed: Mar. 29, 2017

(86) PCT No.: PCT/JP2017/012905
§ 371 (c)(1),
(2) Date: Sep. 25, 2019

(87) PCT Pub. No.: WO2018/179139
PCT Pub. Date: Oct. 4, 2018

(65) Prior Publication Data
US 2020/0037481 A1    Jan. 30, 2020

(51) Int. Cl.
*H05K 13/08*    (2006.01)
*H05K 13/04*    (2006.01)

(52) U.S. Cl.
CPC ....... *H05K 13/0882* (2018.08); *H05K 13/041* (2018.08); *H05K 13/0406* (2018.08); *H05K 13/0409* (2018.08); *H05K 13/0419* (2018.08); *H05K 13/081* (2018.08)

(58) Field of Classification Search
CPC .......... H05K 13/0406; H05K 13/0409; H05K 13/041; H05K 13/0419; H05K 13/081; H05K 13/0882
See application file for complete search history.

(56) References Cited

FOREIGN PATENT DOCUMENTS

| JP | 10-163692 A | | 6/1998 |
|----|----|----|----|
| JP | 2001-102794 | * | 4/2001 |
| JP | 2001-102794 A | | 4/2001 |
| JP | 2002-141698 A | | 5/2002 |
| JP | 2004-225732 A | | 8/2004 |

(Continued)

OTHER PUBLICATIONS

International Search Report dated Jul. 4, 2017 in PCT/JP2017/012905 filed on Mar. 29, 2017.

*Primary Examiner* — Carl J Arbes
(74) *Attorney, Agent, or Firm* — Oblon, McClelland, Maier & Neustadt, L.L.P.

(57) ABSTRACT

A component mounting machine including a head unit that has a head main body configured to hold multiple pickup members each capable of picking up a component at a predetermined interval along a predetermined circumference and to be capable of rotating forward and reverse directions; a moving device configured to move the head unit; a lifting and lowering device configured to lift and lower a pickup member; a component supply device configured to be capable of supplying the component to the pickup member; and a control device configured to control those described above. The control device performs a control such that the pickup members pick up the components supplied by the component supply device, and each component is mounted on a board after a completion of the pickup, while performing an operation of rotating the head main body and an operation of moving the head unit together.

9 Claims, 14 Drawing Sheets

(56) References Cited

FOREIGN PATENT DOCUMENTS

| | | | |
|---|---|---|---|
| JP | 2005-236315 A | | 9/2005 |
| JP | 2011-244004 A | | 12/2011 |
| JP | 2017-046003 | * | 3/2017 |
| JP | 2017-46003 A | | 3/2017 |

* cited by examiner

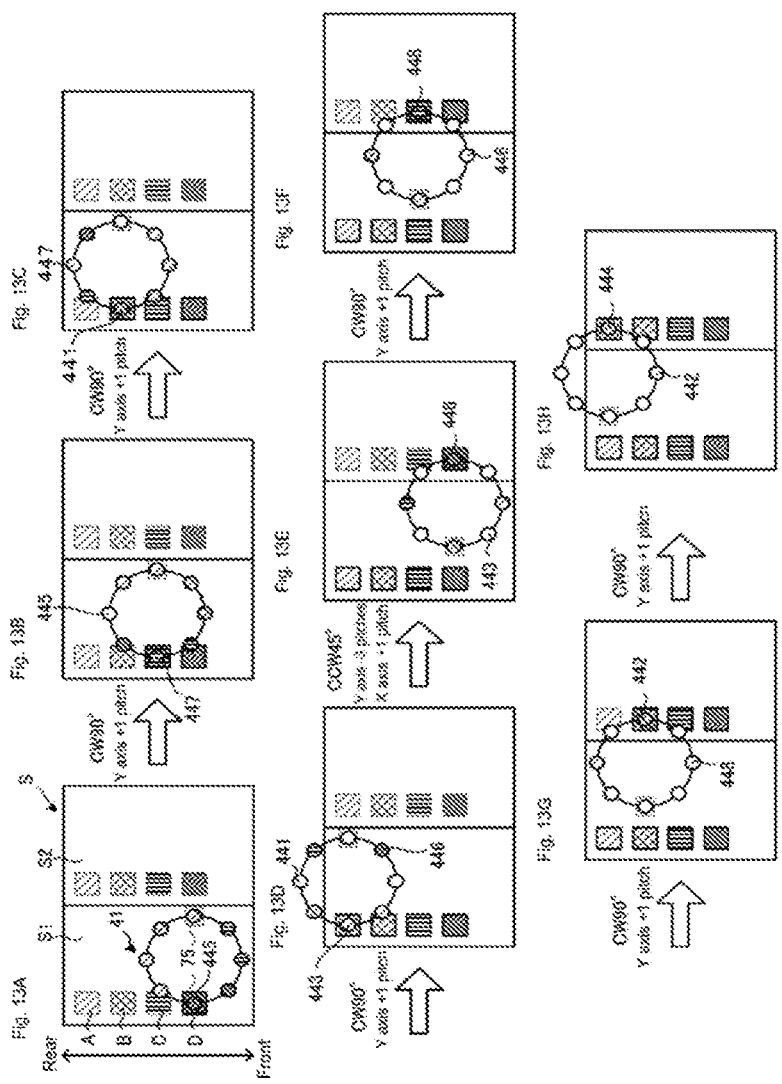

COMPONENT MOUNTING MACHINE

TECHNICAL FIELD

The present specification discloses a component mounting machine.

BACKGROUND ART

There is a known component mounting machine in which multiple nozzles included on a rotary head pick up components, which are supplied from multiple feeders, and mount the components on a board. Patent literature 1 discloses a gear device that rotates a rotating body of a rotary head in forward and reverse directions in this type of a component mounting machine.

PATENT LITERATURE

Patent Literature 1: JP-A-2004-225732

BRIEF SUMMARY

Technical Problem

However, patent literature 1 does not disclose a situation in which the forward and reverse rotation of the rotating body is used. On the one hand, in a component mounting machine, there is a demand to shorten a time required for the multiple nozzles of the rotary head to pick up components and a time required for the components held by the nozzles to be mounted on the board.

The present disclosure has been made to solve the above described problems, and a main object thereof is to shorten a time required at the time of component pickup or at the time of component mounting.

Solution to Problem

A component mounting machine of the present disclosure is a component mounting machine including:

a head unit that has a head main body configured to hold multiple pickup members, each capable of picking up a component, at a predetermined interval along a predetermined circumference and that is capable of rotating in forward and reverse directions, the head unit being configured to revolve the multiple pickup members by rotating the head main body;

a moving device configured to move the head unit;

a lifting and lowering device that is provided in the head unit independently of the head main body, and the lifting and lowering device being configured to lift and lower a pickup member which is positioned at a predetermined position of the head unit among the multiple pickup members;

multiple component supply devices, each capable of supplying the component to the pickup member that is positioned at the predetermined position; and a control device configured to control the head main body, the moving device, the lifting and lowering device, and the component supply device in such a way that the pickup members, each being positioned at the predetermined position, pick up the respective components supplied by the component supply device, the components each being mounted on a board after completion of the pickup, while performing an operation of rotating the head main body and an operation of moving the head unit together, wherein the control device is configured to be capable of performing one or both of an operation of reversing a rotational direction of the head main body and an operation of rotating the head main body n times the interval, where n is an integer of two or greater, at least either at the time of component pickup or at the time of component mounting.

In the component mounting machine, the pickup member positioned at the predetermined position of the head unit picks up the component supplied by the component supply device and each component is mounted on the board after the completion of the pickup, while performing the operation of rotating the head main body and the operation of moving the head unit together. In addition, at least either at the time of the component pickup or at the time of the component mounting, it is possible to perform the control such that one or both of the operation of reversing the rotational direction of the head main body and the operation of rotating the head main body n times the interval, where n is an integer of two or greater, between the pickup members are performed. Accordingly, it is possible to shorten a time required at the time of the component pickup or at the time of the component mounting, compared to a conventional component mounting machine.

BRIEF DESCRIPTION OF DRAWINGS

FIG. 11 illustrates a procedure for nozzles 441 to 448 to pick up components.

FIG. 12 illustrates a procedure for nozzles 441 to 448 to pick up components, for comparison.

FIG. 13 illustrates a procedure for mounting the components picked up by nozzles 441 to 448.

DESCRIPTION OF EMBODIMENTS

Preferred embodiments of the component mounting machine of the present disclosure will be described below with reference to the drawings. Note that a left-right direction in FIG. 1 is an X-axis direction, a front-rear direction is a Y-axis direction, and an up-down direction is a Z-axis direction.

Figure 1:
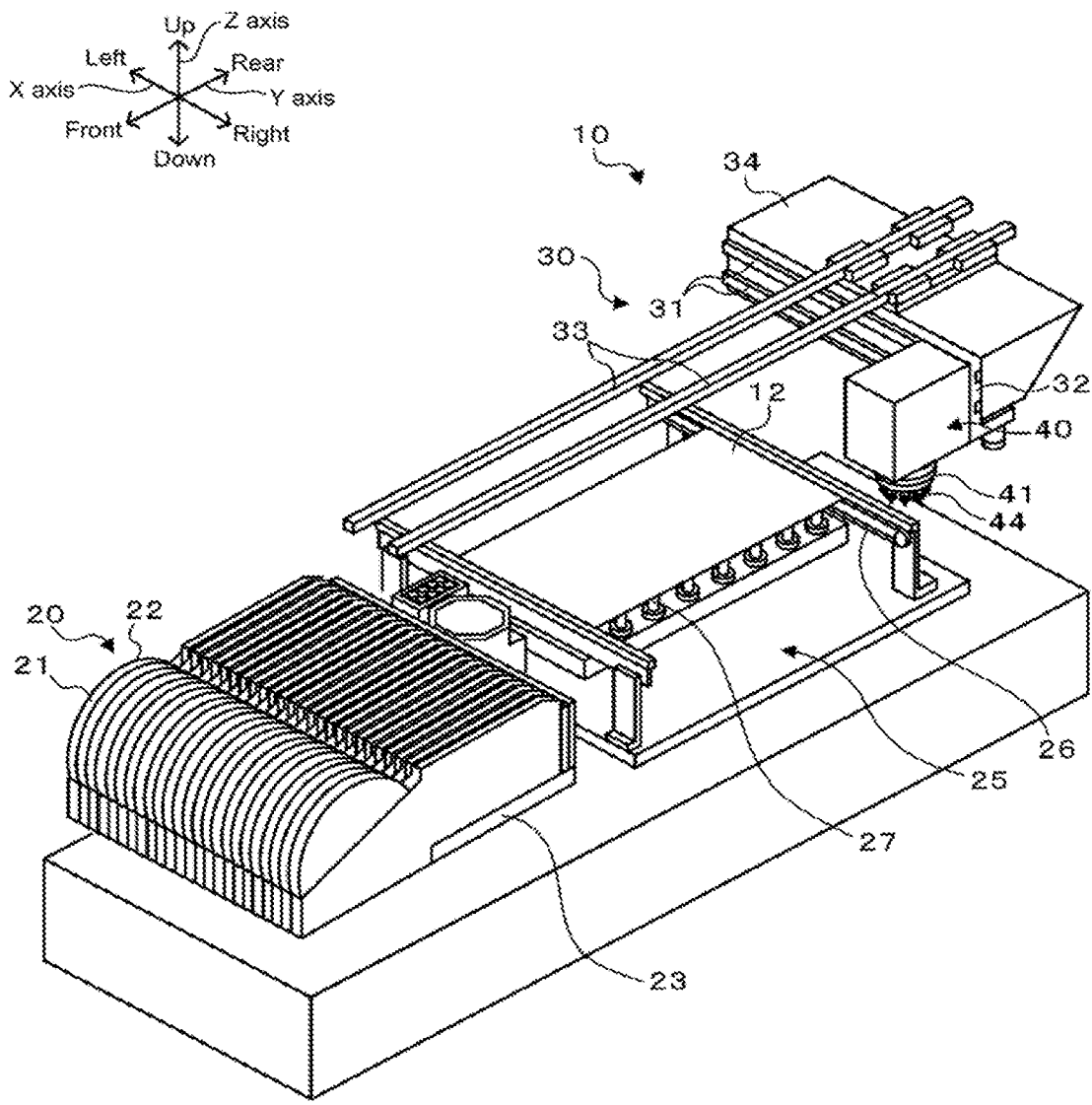
FIG. 1 is a perspective view showing a schematic configuration of component mounting machine 10.
Figure 9:
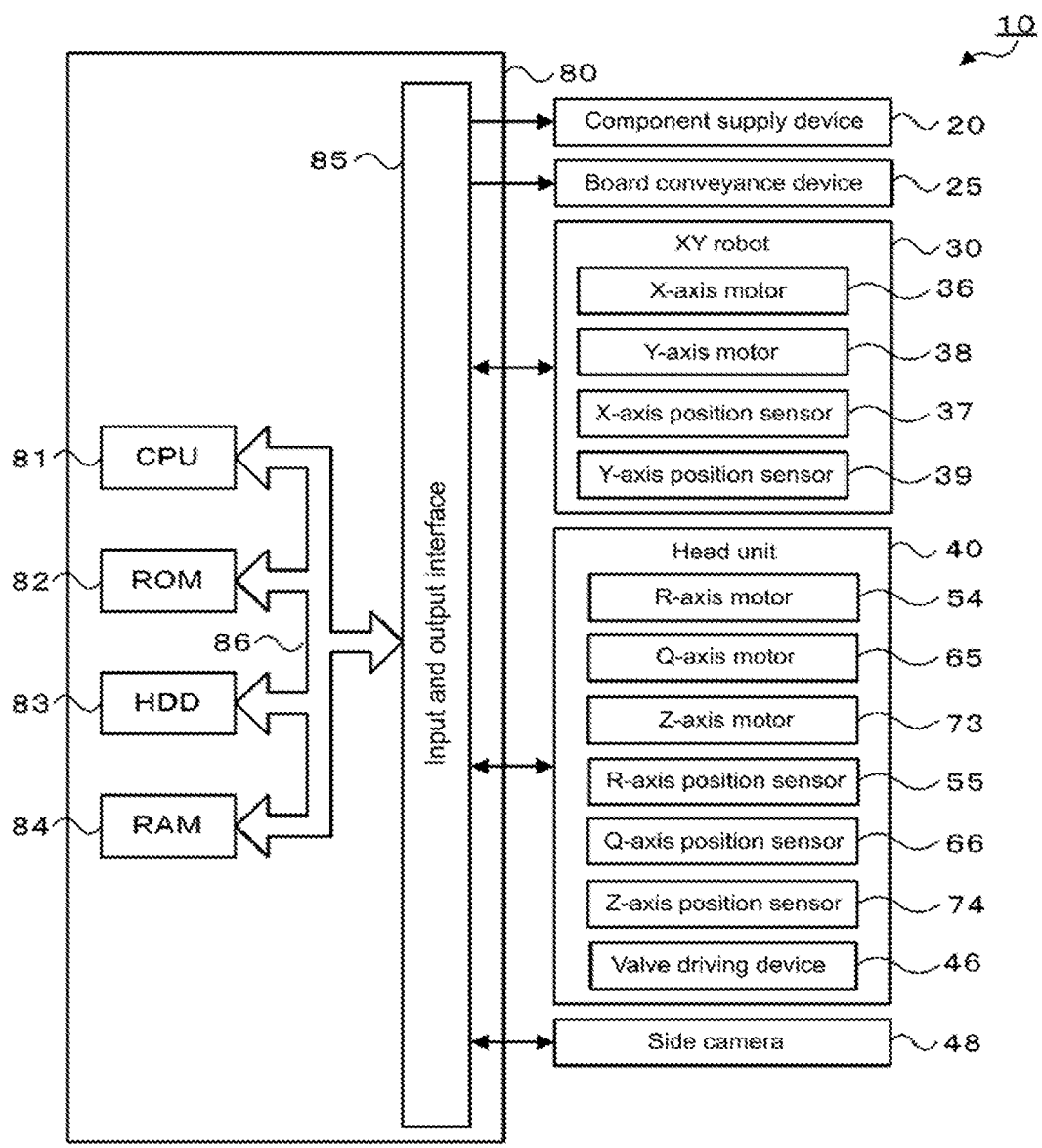
FIG. 9 shows an electric connection relationship of control device 80.

As shown in FIG. 1, component mounting machine 10 includes component supply device 20, board conveyance device 25, XY-robot 30, head unit 40, and control device 80 (see FIG. 9).

Figure 2:
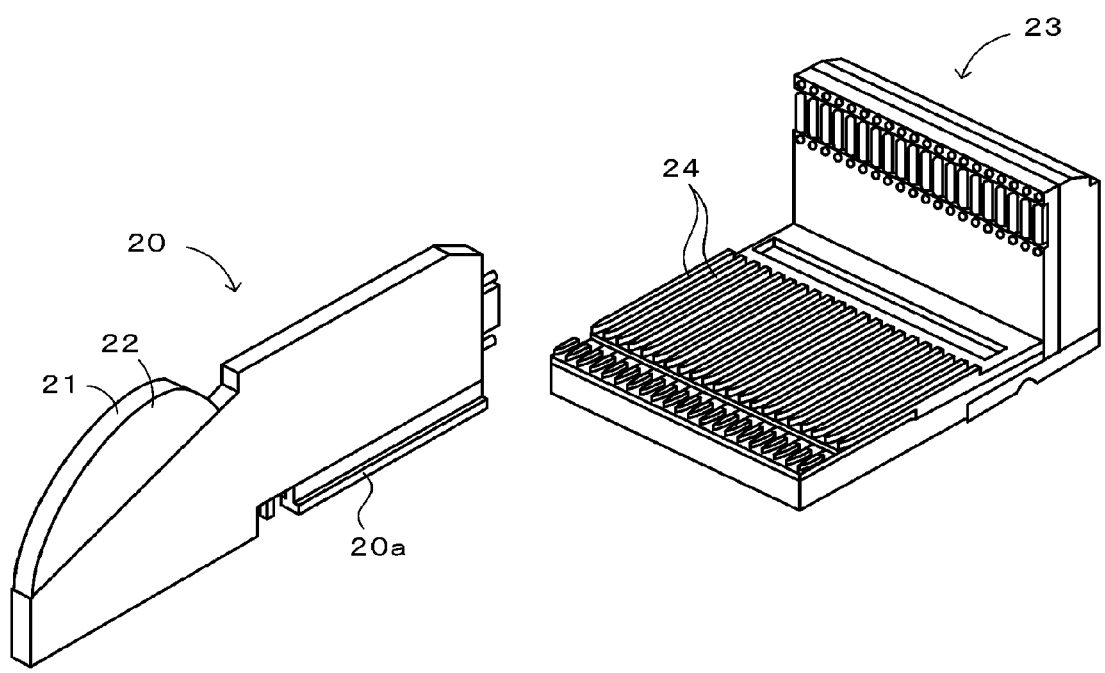
FIG. 2 is a perspective view of component supply device 20 and feeder table 23.

Component supply device 20 is configured as a tape feeder that supplies a component to a component supply position by pulling tape 21 which accommodates components from reel 22 and pitch-feeding the components. As shown in FIG. 2, component supply device 20 is set by including rail member 20a on a bottom surface and sliding rail member 20a, from front to rear, into slot 24 of feeder table 23 disposed on a front side of component mounting machine 10. Multiple component supply devices 20 are set on feeder table 23 so as to be arranged in the left-right direction (X-axis direction). Note that component supply device 20 may be set over two or more slots 24 depending on a size of the component.

Board conveyance device 25 has a pair of conveyor belts 26, 26 (only one shown in FIG. 1) which are provided to be spaced in front and behind and stretch in the left-right direction, as shown in FIG. 1. In a case where board S is conveyed by conveyor belts 26, 26 and reaches a predetermined loading position, board S is supported by multiple support pins 27 erected on a rear surface side.

As shown in FIG. 1, XY-robot 30 includes a pair of left and right Y-axis guide rails 33, 33 provided along the front-rear direction (Y-axis direction), and Y-axis slider 34 stretching across the pair of left and right Y-axis guide rails 33, 33. XY-robot 30 includes X-axis guide rails 31 and 31 provided on a front surface of Y-axis slider 34 along the left-right direction (X-axis direction) and X-axis slider 32 attached to X-axis guide rails 31 and 31. X-axis slider 32 is movable in the X-axis direction by the driving of X-axis motor 36 (see FIG. 9), and Y-axis slider 34 is movable in the Y-axis direction by the driving of Y-axis motor 38 (see FIG. 9). Note that for X-axis slider 32, a position in the X-axis direction is detected by X-axis position sensor 37 (see FIG. 9), and for Y-axis slider 34, the position in the Y-axis direction is detected by Y-axis position sensor 39 (see FIG. 9). Head unit 40 is attached to X-axis slider 32. Head unit 40 is moved to any position on an XY-plane by driving and controlling XY-robot 30.

Figure 3:
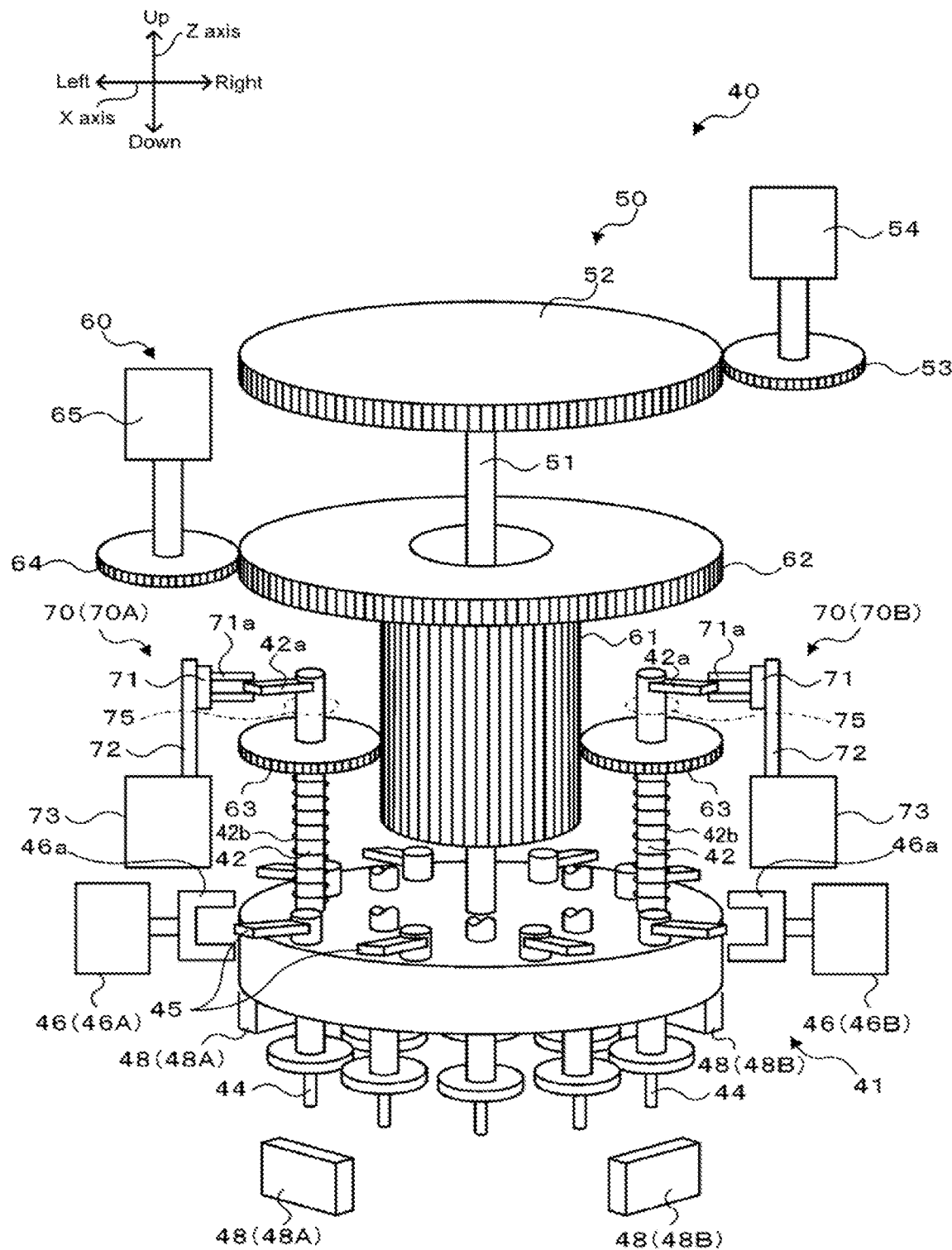
FIG. 3 shows a schematic configuration of head unit 40.

As shown in FIG. 3, head unit 40 includes head main body 41, valve driving device 46, R-axis driving device 50, Q-axis driving device 60, and Z-axis driving device 70.

Head main body 41 is a cylindrical rotating body, and includes nozzle holder 42, nozzle 44, and valve operation lever 45. Multiple nozzle holders 42 are provided at predetermined intervals in a circumferential direction of head main body 41 (here, eight at every center angle of 45°). Nozzle 44 is exchangeably attached to a tip portion of each nozzle holder 42. Nozzle 44 picks up the component in a case where negative pressure is supplied via a pressure adjustment valve (not shown), and releases the component in a case where positive pressure is supplied. Valve operation lever 45 is a lever that operates the pressure adjustment valve, and is provided for each nozzle 44 along a circumference of head main body 41. Valve operation lever 45 is an alternate type lever, and is switchable between a negative pressure supply position for supplying negative pressure to nozzle 44, an atmospheric pressure supply position for supplying atmospheric pressure to nozzle 44, and a positive pressure supply position for supplying positive pressure to nozzle 44.

Figure 4:
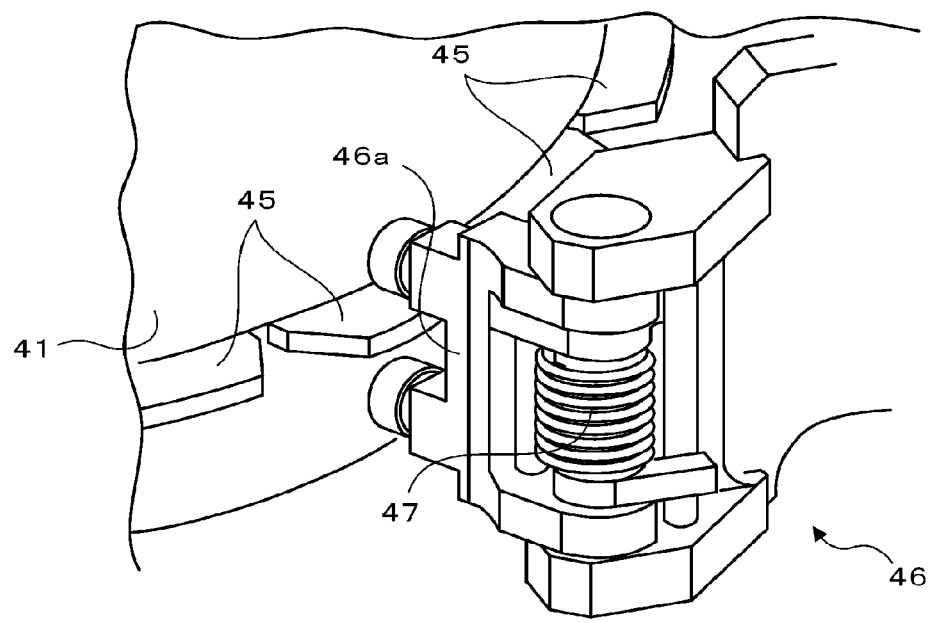
FIG. 4 is a perspective view of lever gripping section 46*a* gripping valve operation lever 45.
Figure 5:
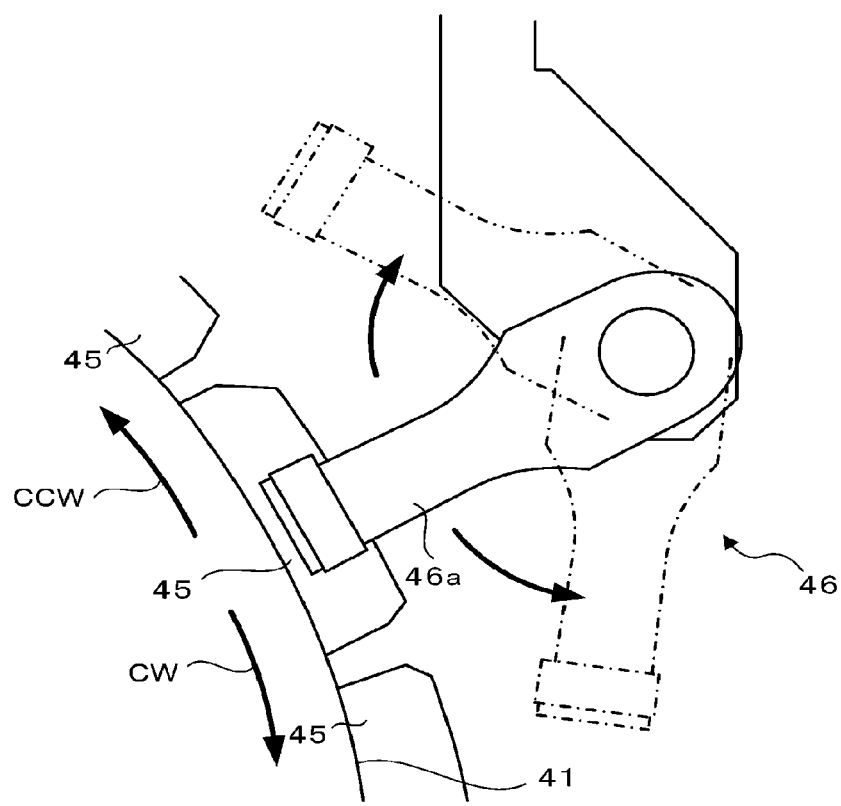
FIG. 5 is a plan view of lever gripping section 46*a* gripping valve operation lever 45.

Valve driving devices 46 are provided at two locations on a revolving trajectory (the revolution) of valve operation lever 45, and are configured to be capable of individually lifting and lowering valve operation levers 45 at two locations. In the present embodiment, valve driving devices 46 are provided to face each other, on the left and the right, across the center of head main body 41. Valve driving device 46 includes lever gripping section 46a that grips a horizontal surface of valve operation lever 45 in the up-down direction, and positions valve operation lever 45 at any position by lifting and lowering lever gripping section 46a. As shown in FIG. 4, lever gripping section 46a is attached to be rotatable around vertical shaft 47 via a spring, and is normally held in an orientation substantially perpendicular to a cylindrical side surface of head main body 41. Here, as shown in FIG. 5, head main body 41 is rotatable both clockwise CW (a forward direction) and counterclockwise CCW (a reverse direction). In addition, lever gripping section 46a is normally held by the spring at the position indicated by a solid line in FIG. 5. When head main body 41 rotates clockwise CW, in a case where a member attached to head main body 41 (for example, valve operation lever 45) interferes with (contacts) lever gripping section 46a, due to some circumstances, lever gripping section 46a is pushed by the member to rotate, and reaches a first retraction position (see a one-dot chain line in FIG. 5). In addition, when head main body 41 is rotated counterclockwise CCW, in a case where the member attached to head main body 41 (for example, valve operation lever 45) interferes with (contacts) lever gripping section 46a, due to some circumstances, lever gripping section 46a is pushed by the member to rotate, and reaches a second retraction position (see a two-dot chain line in FIG. 5). Lever gripping section 46a automatically returns to a normal position (a solid line in FIG. 5) by the spring after reaching any of the retraction positions. Note that hereinafter, valve driving device 46 provided on a left side of head unit 40 may be referred to as first valve driving device 46A, and valve driving device 46 provided on a right side may be referred to as second valve driving device 45B.

R-axis driving device 50 includes R shaft 51, R-axis motor 54, and R-axis position sensor 55 (see FIG. 9) as shown in FIG. 3. R shaft 51 extends in the up-down direction, and a lower end thereof is attached to the central shaft of head main body 41. R-axis motor 54 rotationally drives gear 53 meshing with R-axis gear 52 provided at an upper end of R shaft 51. R-axis position sensor 55 detects a rotational position of R-axis motor 54. R-axis driving device 50 rotationally drives R shaft 51 via gear 53 and R-axis gear 52 by R-axis motor 54, thereby revolving (the revolution) multiple nozzle holders 42 supported by head main body 41 in the circumferential direction together with multiple nozzles 44. That is, nozzle 44 intermittently rotates at the predetermined intervals. Head main body 41 is capable of revolving both clockwise CW (the forward direction) and counterclockwise CCW (the reverse direction) when viewed from above. In the present embodiment, the number of nozzle holders 42 and the number of nozzles 44 are respectively eight, so that the rotation is intermittently made at every center angle of 45°.

Q-axis driving device 60 includes upper and lower Q-axis gears 61, 62 of two stages, gears 63, 64, Q-axis motor 65, and Q-axis position sensor 66 (see FIG. 9). Upper and lower Q-axis gears 61, 62 of two stages are inserted coaxially and rotatably relative to R shaft 51. Gear 63 is provided at an upper portion of each nozzle holder 42, and is slidably meshes with lower Q-axis gear 61 in the up-down direction. Q-axis motor 65 rotationally drives gear 64 meshing with upper Q-axis gear 62. Q-axis position sensor 66 detects the rotational position of Q-axis motor 65. Q-axis driving device 60 rotationally drives Q-axis gears 61, 62 by Q-axis motor 65, thereby rotating gear 63 meshing with Q-axis gear 61 to rotate each nozzle holder 42 around the center axis thereof in the same rotational direction by the same rotation amount. Along with this, nozzle 44 also rotates.

Figure 6:
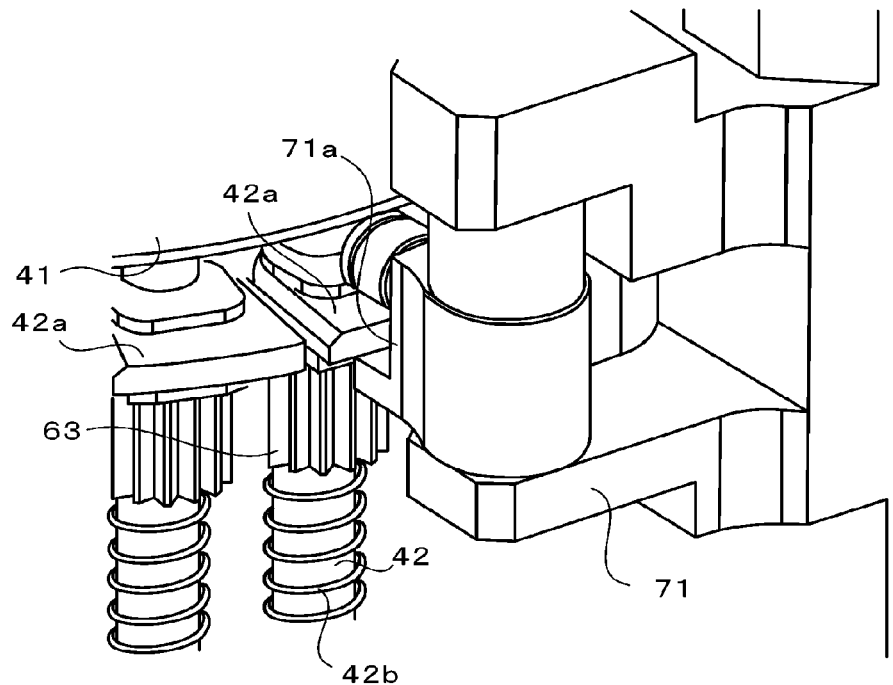
FIG. 6 is a perspective view of engagement piece gripping section 71*a* gripping engagement piece 42*a*.

Z-axis driving devices 70 are provided at two locations on the revolving trajectory (the revolution) of nozzle holder 42, and are configured to be capable of individually lifting and lowering nozzle holders 42 at the two locations. In the present embodiment, Z-axis driving devices 70 are provided to face each other, on the left and right, across the center of head main body 41. Z-axis driving device 70 includes Z-axis slider 71, Z-axis motor 73, and Z-axis position sensor 74 (see FIG. 9). Z-axis slider 71 is attached to ball screw 72 extending in the up-down direction to be capable of being lifted and lowered. Z-axis slider 71 includes engagement piece gripping section 71*a* that grips a horizontal surface of engagement piece 42*a* extending laterally from nozzle holder 42 (in a direction perpendicular to the cylindrical side surface of head main body 41) (see FIG. 6). Z-axis motor 73 lifts and lowers Z-axis slider 71 by rotating ball screw 72. Z-axis position sensor 74 detects the lifting and lowering position of Z-axis slider 71. Z-axis driving device 70 drives Z-axis motor 73 to lift and lower Z-axis slider 71 along ball screw 72, thereby lifting and lowering nozzle holder 42 and nozzle 44 integrated with Z-axis slider 71. In a case where nozzle holder 42 rotates together with head main body 41 and is positioned at a location where Z-axis driving device 70 is disposed (lifting and lowering position 75, see FIG. 3), engagement piece 42*a* of above-described nozzle holder 42 is gripped by engagement piece gripping section 71*a* of Z-axis slider 71. In addition, in a case where nozzle holder 42 is separated from lifting and lowering position 75, engagement piece 42*a* of above-described nozzle holder 42 is pulled out of engagement piece gripping section 71*a* of Z-axis slider 71. For nozzle holder 42, the upper end is in contact with gear 63 and is inserted into spring 42*b* whose lower end is in contact with the upper surface of head main body 41. Therefore, in a state of not being gripped by engagement piece gripping section 71*a*, engagement piece 42*a* is positioned in a regular position in the up-down direction by spring 42*b*. Z-axis driving device 70 corresponds to a nozzle lifting and lowering device. Note that hereinafter, Z-axis driving device 70 provided on the left side of head unit 40 may be referred to as first Z-axis driving device 70A, and Z-axis driving device 70 provided on the right side may be referred to as second Z-axis driving device 70B.

Figure 7:
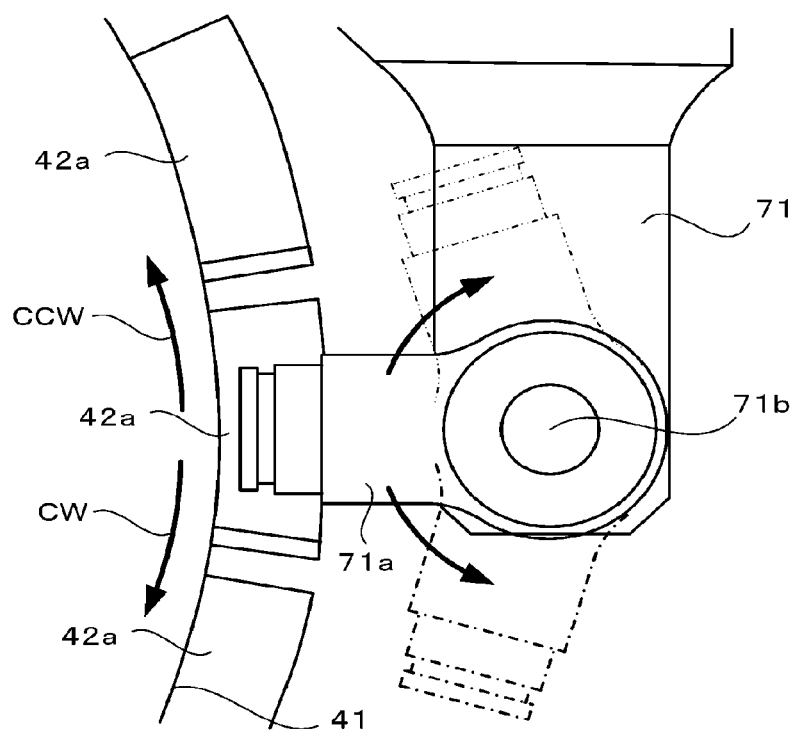
FIG. 7 is a plan view of engagement piece gripping section 71*a* gripping engagement piece 42*a*.

Here, as shown in FIG. 7, head main body 41 is capable of rotating both clockwise CW (the forward direction) and counterclockwise CCW (the reverse direction). In addition, engagement piece gripping section 71*a* is attached to be rotatable around vertical shaft 71*b*, however, engagement piece gripping section 71*a* is normally held by the spring or the like in an orientation shown by a solid line in FIG. 7 (an orientation substantially perpendicular to the cylindrical side surface of head main body 41). When head main body 41 rotates clockwise CW, in a case where a member attached to head main body 41 (for example, engagement piece 42*a*) interferes with (contacts) engagement piece gripping section 71*a*, due to some circumstances, engagement piece gripping section 71*a* is pushed by the member to rotate, and is held by a first retraction position (see a one-dot chain line in FIG. 7). When head main body 41 rotates counterclockwise CCW, in a case where the member attached to head main body 41 (for example, engagement piece 42*a*) interferes with (contacts) engagement piece gripping section 71*a*, due to some circumstances, engagement piece gripping section 71*a* is pushed by the member to rotate, and is held at a second retraction position (see a two-dot chain line in FIG. 7). When engagement piece gripping section 71*a* is held in the first and second retraction positions, even in a case where head main body 41 rotates in any direction of the forward direction and the reverse direction, engagement piece gripping section 71*a* does not interfere with other members. Note that engagement piece gripping section 71*a* at any of the retraction positions is capable of easily returning to a normal position (a solid line in FIG. 7) by an operator's manual operation.

Figure 8:
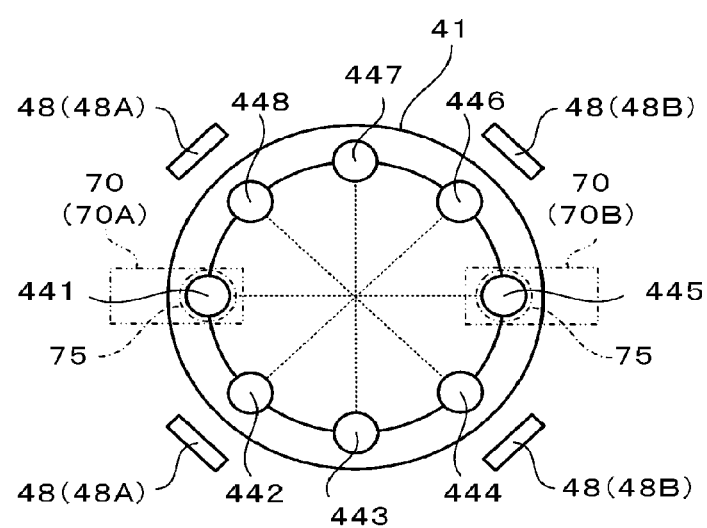
FIG. 8 is a plan view of head main body 41.

In the plan view of head main body 41 shown in FIG. 8, eight nozzles 44 are disposed at equal intervals. For convenience of description, eight nozzles 44 will be referred to as nozzles 441 to 448. Nozzles 441 and 445 are facing each other with the center axis of head main body 41 interposed therebetween. Therefore, nozzles 441 and 445 will be referred to as the same set of nozzles. The same applies to nozzles 442 and 446, nozzles 443 and 447, and nozzles 444 and 448. In addition, for example, in a case where nozzle 441 is disposed at lifting and lowering position 75 driven by first Z-axis driving device 70A, nozzle 445 is disposed at lifting and lowering position 75 driven by second Z-axis driving device 70B. Therefore, the same set of nozzles is capable of being lifted and lowered simultaneously by the first and second Z-axis driving devices 70A, 70B.

As shown in FIGS. 3 and 8, side camera 48 images a vicinity of the tip portion of nozzle 44 from the side in order to determine a presence or absence of a component on nozzle 44 and an orientation of the picked up component after pickup operation by nozzle 44 has been executed. In the present embodiment, side cameras 48 are provided at two positions in the vicinity of first Z-axis driving device 70A, and at two positions in the vicinity of second Z-axis driving device 70B. Hereinafter, two side cameras 48 in the vicinity of first Z-axis driving device 70A will be referred to as first side camera 48A, and two side cameras 48 in the vicinity of the second Z-axis driving device 70B will be referred to as second side camera 48B. After nozzle 44 is lowered by first Z-axis driving device 70A to execute the pickup operation, when nozzle 44 revolves clockwise to a position of next one, one first side camera 48A is capable of imaging above described nozzle 44, and when nozzle 44 revolves counterclockwise to a next position, the other first side camera 48A is capable of imaging above described nozzle 44. In addition, after nozzle 44 is lowered by second Z-axis driving device 70B to execute the pickup operation, when nozzle 44 revolves clockwise to a next position, one second side camera 48B is capable of imaging above described nozzle 44, and when nozzle 44 revolves counterclockwise to a next, the other second side camera 48B is capable of imaging above described nozzle 44.

As shown in FIG. 9, control device 80 is configured as a microprocessor made up mainly of CPU 81, and includes ROM 82, HDD 83, RAM 84, input and output interface 85, and the like in addition to CPU 81. These are connected via bus 86. Detection signal from XY-robot 30 (X-axis position sensor 37 and Y-axis position sensor 39), detection signal from head unit 40 (R-axis position sensor 55, Q-axis position sensor 66, and Z-axis position sensor 74), image signal from side camera 48, and the like are input to control device 80 via input and output interface 85. In addition, control device 80 outputs a control signal to component supply device 20, a control signal to board conveyance device 25, a control signal to XY-robot 30 (X-axis motor 36 and Y-axis motor 38), a control signal to head unit 40 (R-axis motor 54, Q-axis motor 65, Z-axis motor 73, and valve driving device 46), a control signal to side camera 48, and the like via input and output interface 85.

Figure 10:
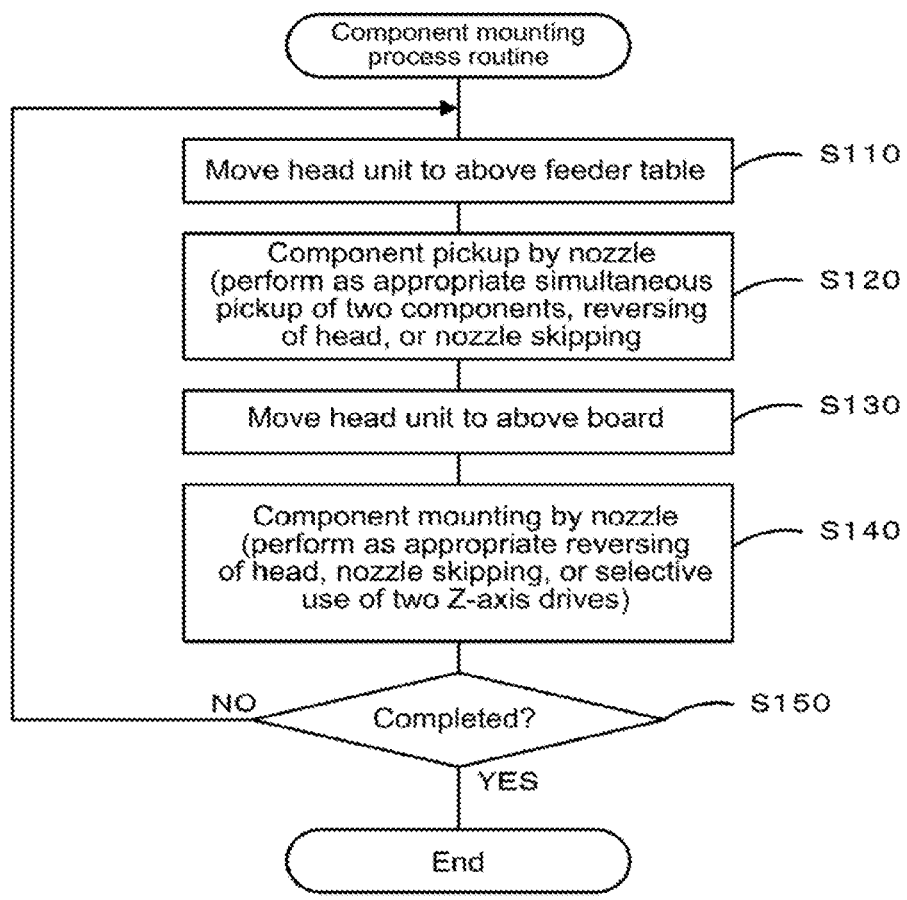
FIG. 10 is a flowchart of a component mounting process routine.

Subsequently, the operation when component mounting machine 10 performs a component mounting process will be described. CPU 81 of control device 80 controls each section of component mounting machine 10, based on a production program received from a management device (not shown), to produce board S on which multiple components are mounted. Specifically, CPU 81 reads a program of a component mounting process routine from HDD 83 and executes the program. FIG. 10 is a flowchart of a component mounting process routine.

First, CPU 81 controls XY-robot 30 to move head unit 40 to above feeder table 23 (S110), and sequentially causes nozzle 44 to pick up a component (S120). In S120, CPU 81 controls XY-robot 30 and head unit 40 to sequentially cause nozzles 44 to pick up components supplied by component supply device 20 while causing two nozzles 44 to simultaneously pick up the components, reversing the rotation of head main body 41, or performing nozzle skipping (an operation of rotating head main body 41 by 90° or more). This point will be described in detail later. Subsequently, CPU 81 controls XY-robot 30 to move head unit 40 to above board S (S130), and sequentially mounts the component picked up by nozzle 44 to a predetermined position of board S (S140). In S140, CPU 81 controls XY-robot 30 and head unit 40 to sequentially mount the component picked up by nozzle 44 at the predetermined position on board S while reversing the rotation of head main body 41, performing the nozzle skipping, or selectively using the first and second Z-axis driving devices 70A, 70B. This point will also be described in detail later. Then, CPU 81 determines whether the mounting of all the components to be mounted on board S has been completed (S150), and again executes S110 and subsequent processes in a case of not being completed, and ends the routine in a case of being completed.

Subsequently, an example of specific processes of the above described S120 will be described in detail with reference to FIG. 11. FIG. 11 is an explanatory diagram of a procedure for nozzles 441 to 448 to pick up components. In FIG. 11, among the first to eighth slots 24 of feeder table 23, component supply device 20 that supplies component A to component supply position 20p is set in the second slot 24, and component supply device 20 that supplies component B to component supply position 20p is set in the third slot 24. In addition, component supply device 20 that supplies component C to component supply position 20p is set so as to straddle the fourth to sixth slots 24 of, and component supply device 20 that supplies component D to component supply position 20p is set in seventh slot 24. Component C is larger in size than the other components A, B and D.

Figures 11A, 11B, 11C, 11D, 11E, 11F, 11G:
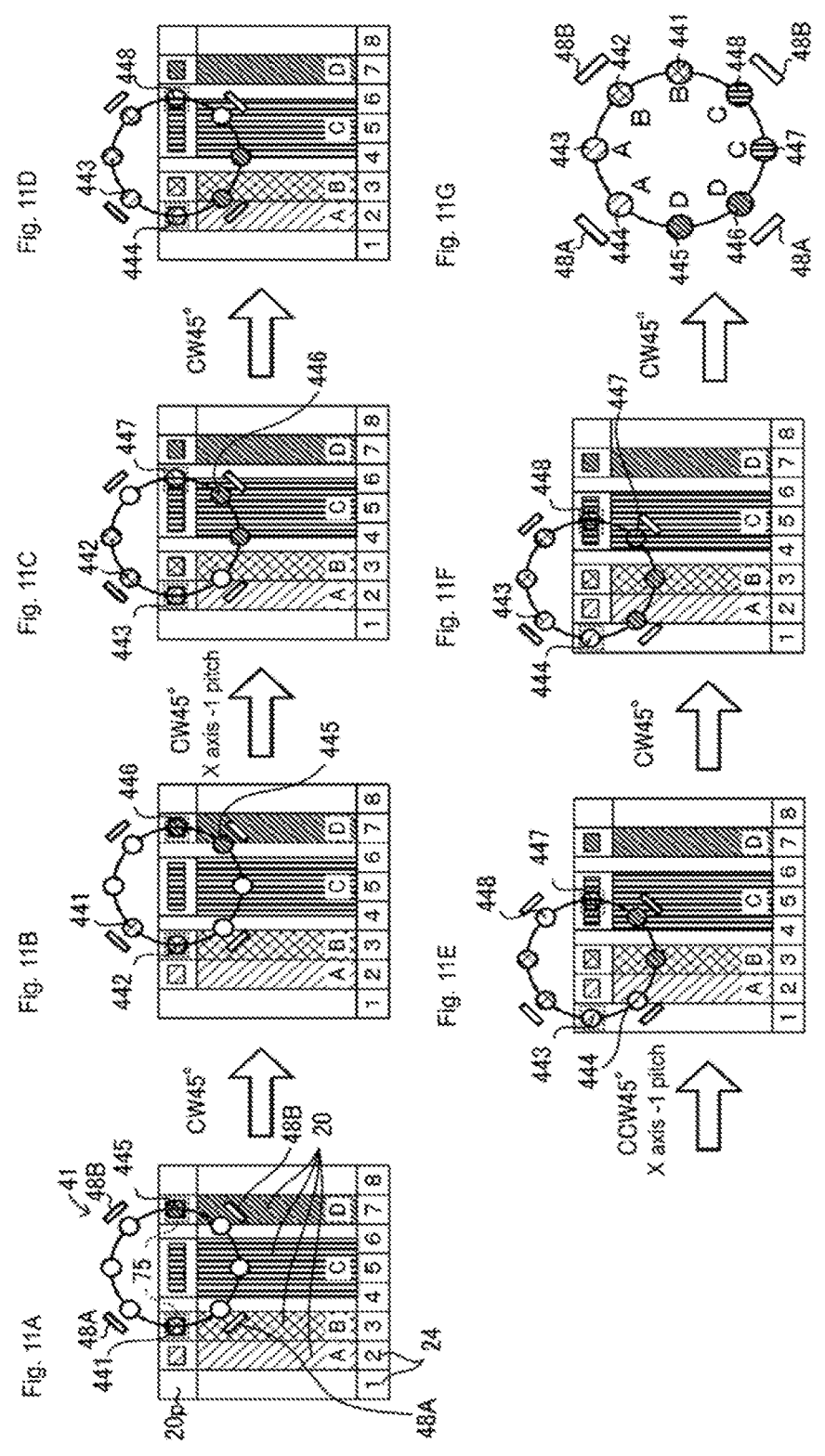

First, CPU 81 causes nozzles 441, 445 positioned at two lifting and lowering positions 75 to face components B, D, respectively, and controls first and second Z-axis driving devices 70A, 70B and first and second valve driving devices 46A, 46B to causes nozzles 441, 445 to simultaneously pick up components B, D (see FIG. 11A). Subsequently, CPU 81 rotates head main body 41 clockwise CW by 45°, for nozzles 442, 446 to be positioned at two lifting and lowering positions 75, so that nozzles 442, 446 face components B, D, respectively, and causes, in such a state, nozzles 442, 446 to simultaneously pick up components B, D (see FIG. 11B). Simultaneously, side cameras 48A, 48B image nozzles 441, 445 to check for the presence or absence of the component, and the orientation of the component. Subsequently, CPU 81 rotates head main body 41 clockwise CW by 45° and moves head main body 41 by −1 pitch in the X-axis for nozzles 443, 447 to be positioned in two lifting and lowering positions 75, so that nozzle 443 faces component A, and controls, in such a state, first Z-axis driving device 70A and first valve driving device 46A to cause nozzle 443 to pick up component A (see FIG. 11C). Simultaneously, side cameras 48A, 48B image nozzles 442, 446 to check for the presence or absence of the component and the orientation of the component. Note that a case of moving in the left direction along the X-axis is denoted by minus, and a case of moving in the right direction is denoted by plus. In addition, one pitch of the X-axis is a center-to-center distance between two adjacent slots 24. Subsequently, CPU 81 rotates head main body 41 clockwise CW by 45° for nozzles 444, 448 to be positioned at two lifting and lowering positions 75, so that nozzle 444 faces component A, and causes, in such a state, nozzle 444 to pick up component A (see FIG. 11D). Simultaneously, side camera 48A images nozzle 443 to check for the presence or absence of the component and the orientation of the component. Subsequently, CPU 81 rotates head main body 41 counterclockwise to CCW by 45° and moves the head main body 41 by −1 pitch in the X-axis for nozzles 443, 447 to be positioned in two lifting and lowering positions 75, so that nozzle 447 faces component C, and controls, in such a state, second Z-axis driving device 70B and second valve driving device 46B to cause nozzle 447 to pick up component C (see FIG. 11E). Simultaneously, side camera 48A images nozzle 444 to check for the presence or absence of the component and the orientation of the component. Subsequently, CPU 81 rotates head main body 41 clockwise CW by 45° for nozzles 444, 448 to be positioned at two lifting and lowering positions 75, so that nozzle 448 faces component C, and causes, in such a state, nozzle 448 to pick up component C (see FIG. 11F). Simultaneously, side camera B images nozzle 447 to check for the presence or absence of the component and the orientation of the component. Finally, CPU 81 rotates head main body 41 clockwise CW by 45° for side camera B to image nozzle 448 to check for the presence or absence of the component and the orientation of the component (see FIG. 11G). In this manner, CPU 81 causes nozzles 441 to 448 to pick up the components while causing two nozzles 44 to simultaneously pick up the components or while reversing the rotation of head main body 41.

Figures 12A, 12B, 12C, 12D, 12E, 12F, 12G, 12H:
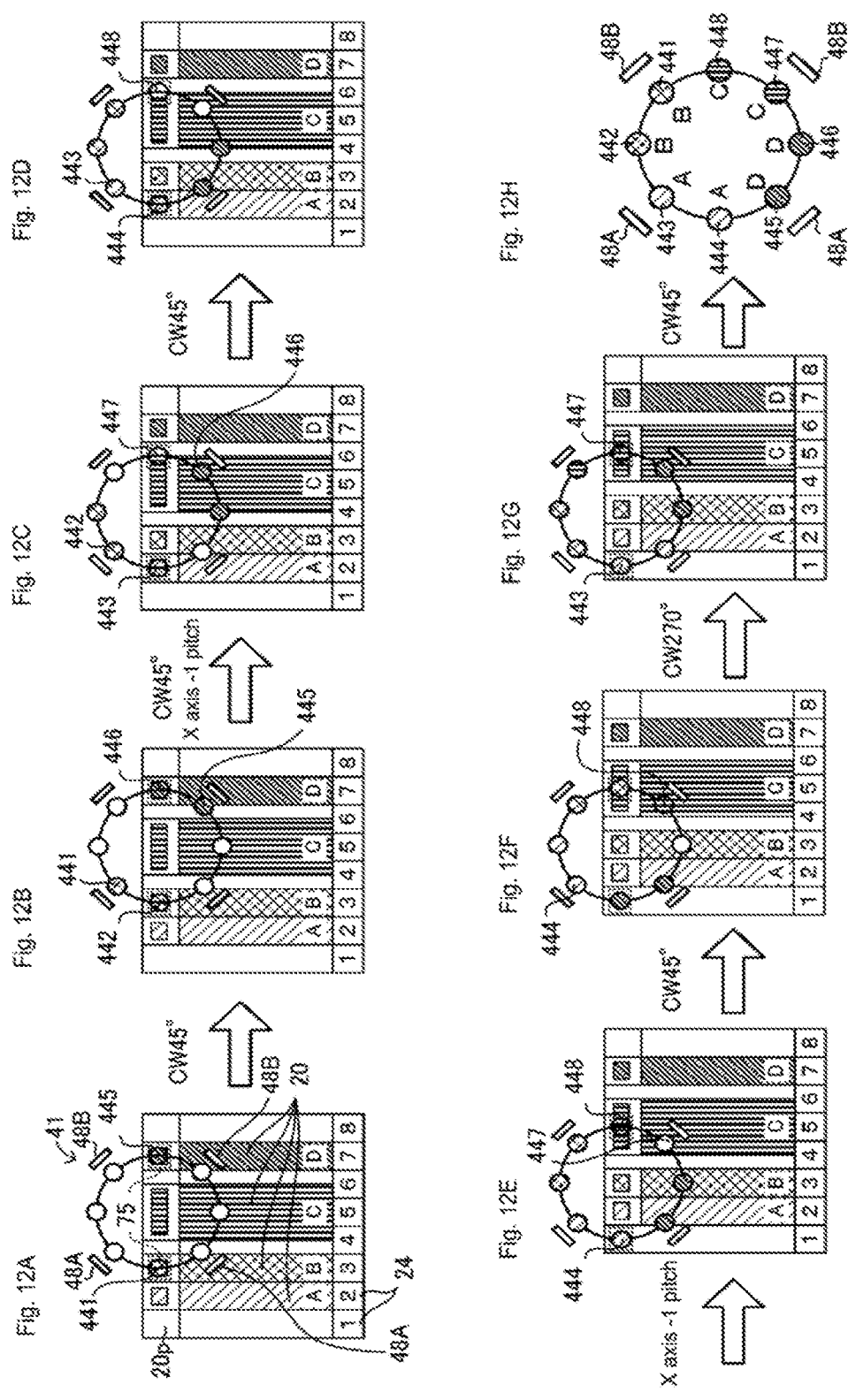

Here, for comparison, an example of a case where CPU 81 causes nozzles 441 to 448 to pick up the components without reversing the rotational direction of head main body 41 will be described below with reference to FIG. 12. FIG. 12 also illustrates a procedure for nozzles 441 to 448 to pick up the components. Since FIGS. 12A to 12D are the same as FIGS. 11A to 11D described above, the procedures after FIG. 12D will be described below. From the state of FIG. 12D, CPU 81 moves head main body 41 by −1 pitch in the X-axis for nozzles 444, 448 to be positioned at two lifting and lowering positions 75, so that nozzle 448 faces component C, and controls, in such a state, second Z-axis driving device 70B and second valve driving device 46B to cause nozzle 448 to pick up component C (see FIG. 12E). Subsequently, CPU 81 rotates head main body 41 clockwise CW by 45° for side cameras 48A, 48B to image nozzles 444, 448 to check for the presence or absence of the component and the orientation of the component (see FIG. 12F) Subsequently, CPU 81 rotates head main body 41 clockwise CW by 270° for nozzles 443, 447 to be positioned at two lifting and lowering positions 75, so that nozzle 447 faces component C, and causes, in such a state, nozzle 447 to pick up component C (see FIG. 12G). Finally, CPU 81 rotates head main body 41 clockwise CW by 45° for side camera B to image nozzle 447 to check for the presence or absence of the component and the orientation of the component (see FIG. 12H). As described above, in the procedure of FIG. 12, head main body 41 is rotated by a large angle of 270°, so that a time required for the suction is longer than that of FIG. 11.

Subsequently, an example of specific processes of the above described S140 will be described in detail with reference to FIG. 13. FIG. 13 illustrates a procedure for mounting the components picked up by nozzles 441 to 448 on board S. In FIG. 13, board S is a two-piece board divided into two small boards S1, S2. The small boards S1, S2 are boards on which the same components are mounted at the same positions, and components A, B, C, D are disposed in a column. In FIG. 13, an outline of a component yet to be mounted is shown by a dotted line, and an outline of an already mounted component is shown by a solid line. In addition, nozzles 441 to 448 after a completion of the component pickup are assumed to be in a state shown in FIG. 11G, and are assumed to have been moved to above board S in such a state.

First, CPU 81 sets nozzle 445 positioned at lifting and lowering position 75 on the left side to be positioned directly above a mounting position of component D of small circuit board S1, controls first Z-axis driving device 70A and first valve driving device 46A to release the pickup of component D by nozzle 445, and mounts component D on board S1 (see FIG. 13A). Subsequently, CPU 81 rotates head main body 41 clockwise CW by 90° and moves head main body 41 by +1 pitch in the Y-axis for nozzle 447 to be positioned at lifting and lowering position 75 on the left side so that above described nozzle 447 is positioned directly above the mounting position of component C of small board S1. Note that a case of moving forward along the Y-axis is denoted by minus, and a case of moving backward is denoted by plus. In addition, one pitch is the center-to-center distance between two component positions adjacent to each other in front and behind. In such a state, CPU 81 controls first Z-axis driving device 70A and first valve driving device 46A to release the pickup of component C by nozzle 447, and mounts component C on board S1 (see FIG. 13B). Subsequently, CPU 81 rotates head main body 41 clockwise CW by 90° and moves head main body 41 by +1 pitch in the Y-axis for nozzle 441 to be positioned at lifting and lowering position 75 on the left side so that above-described nozzle 441 is positioned directly above the mounting position of component B of small board S1. In such a state, CPU 81 controls first Z-axis driving device 70A and first valve driving device 46A to release the pickup of component B by nozzle 441, and mounts component B on board S1 (see FIG. 13C). Subsequently, CPU 81 rotates head main body 41 clockwise CW by 90° and moves head main body 41 by +1 pitch in the Y-axis for nozzle 443 to be positioned at lifting and lowering position 75 on the left side so that above-described nozzle 443 is positioned directly above the mounting position of component A of small board S1. In such a state, CPU 81 controls first Z-axis driving device 70A and first valve driving device 46A to release the pickup of component A by nozzle 443, and mounts component A on board S1 (see FIG. 13D).

Figure 14:
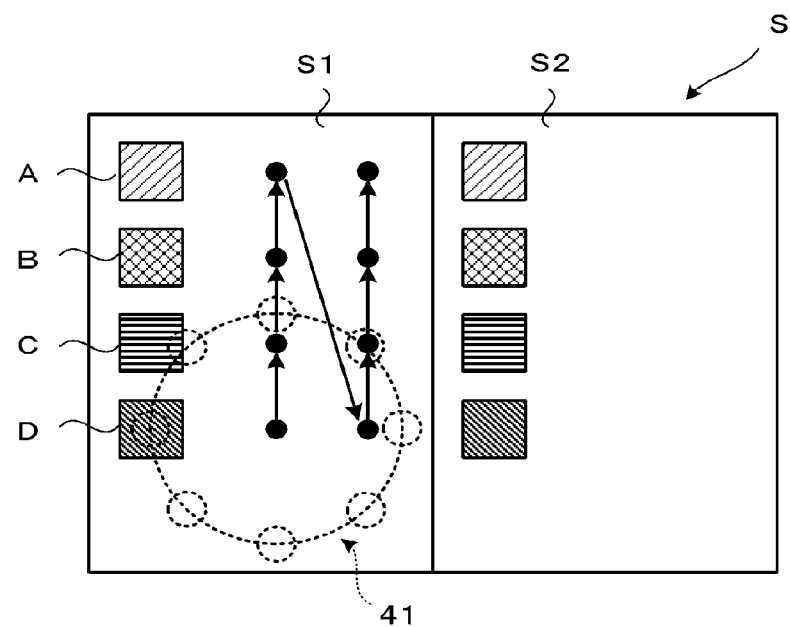
FIG. 14 shows a locus of the center of head main body 41.

Subsequently, CPU 81 rotates head main body 41 counterclockwise CCW by 45° and moves head main body 41 by −3 pitches in the Y-axis and by +1 pitch in the X-axis for nozzle 446 to be positioned at lifting and lowering position 75 on the right side, so that above-described nozzle 446 is positioned directly above the mounting position of component D of small board S2. In such a state, CPU 81 controls second Z-axis driving device 70B and second valve driving device 46B to release the pickup of component D by nozzle 446, and mounts component D on board S2 (see FIG. 13E). Subsequently, CPU 81 rotates head main body 41 clockwise CW by 90° and moves head main body 41 by +1 pitch in the Y-axis for nozzle 448 is positioned at lifting and lowering position 75 on the right side so that nozzle above described 448 is positioned directly above the mounting position of component C of small board S2. In such a state, CPU 81 controls second Z-axis driving device 70B and second valve driving device 46B to release the pickup of component C by nozzle 448, and mounts component C on board S2 (see FIG. 13F). Subsequently, CPU 81 rotates head main body 41 clockwise CW by 90° and moves head main body 41 by +1 pitch in the Y-axis for nozzle 442 to be positioned at lifting and lowering position 75 on the right side so that above-described nozzle 442 is positioned directly above the mounting position of component B of small board S2. In such a state, CPU 81 controls second Z-axis driving device 70B and second valve driving device 46B to release the pickup of component B by nozzle 442, and mounts component B on board S2 (see FIG. 13G). Subsequently, CPU 81 rotates head main body 41 clockwise CW by 90° and moves head main body 41 by +1 pitch in the Y-axis for nozzle 444 to be positioned at lifting and lowering position 75 on the right side so that above-described nozzle 444 is positioned directly above the mounting position of component A of small board S2. In such a state, CPU 81 controls second Z-axis driving device 70B and second valve driving device 46B to release the pickup of component A by nozzle 444, and mounts component A to board S2 (see FIG. 13H). In this manner, CPU 81 mounts the components picked up by nozzles 441 to 448 on board S while performing the nozzle skipping of rotating head main body 41 by 90° (twice 45°), reversing the rotation of head main body 41, or selectively using the first and second Z-axis driving devices 70A, 70B. The locus of the center of head main body 41 at this time is indicated by an arrow in FIG. 14.

Figure 15:
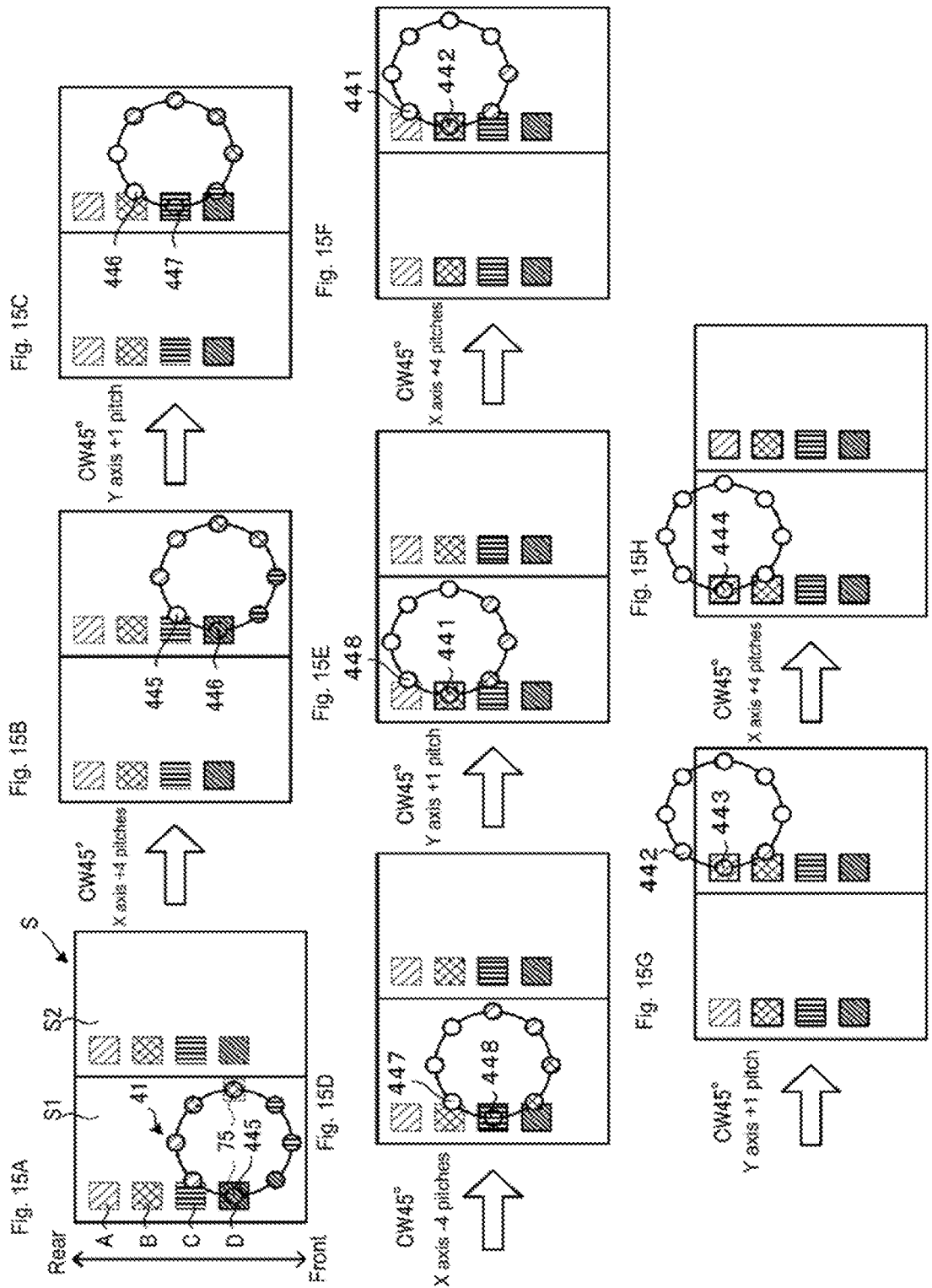
FIG. 15 illustrates a procedure for mounting components picked up by nozzles 441 to 448, for comparison.

Here, for comparison, an example of a case in which the components picked up by nozzles 441 to 448 are mounted on board S without the nozzle skipping, the reversing of head main body 41, or the separate use of first and second Z-axis driving devices 70A, 70B, will be described with reference to FIG. 15.

Figure 16:
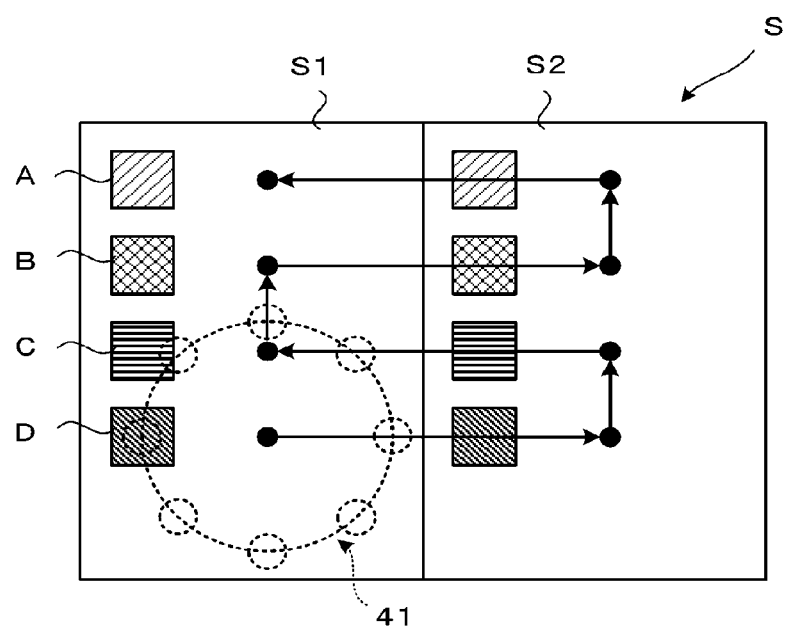
FIG. 16 shows the locus of the center of head main body 41, for comparison.

First, CPU 81 sets nozzle 445 positioned at lifting and lowering position 75 on the left side to be positioned directly above the mounting position of component D of small circuit board S1, controls first Z-axis driving device 70A and first valve driving device 46A to release the pickup of component D by nozzle 445, and mounts component D on board S1 (see FIG. 15A). Subsequently, CPU 81 rotates head main body 41 clockwise CW by 45° and moves head main body 41 by +4 pitches in the X-axis for nozzle 446 to be positioned at lifting and lowering position 75 on the left side so that above described nozzle 446 is positioned directly above the mounting position of component D of small board S2. In such a state, CPU 81 controls first Z-axis driving device 70A and first valve driving device 46A to release the pickup of component D by nozzle 446, and mounts component D on board S2 (see FIG. 15B). Then, as shown in FIGS. 15C to 15H, the component is mounted using first Z-axis driving device 70A and first valve driving device 46A while head main body 41 is rotated clockwise CW by 45°, and appropriately moved in the X-axis or the Y-axis. The locus of the center of head main body 41 at this time is indicated by an arrow in FIG. 16. A comparison between FIG. 14 and FIG. 16 clearly shows that in FIG. 14, a movement distance of head main body 41 is smaller, and thus a time required for mounting the components is shorter.

Here, a correspondence relationship between constituent elements of component mounting machine 10 of the present embodiment and constituent elements of the component mounting machine of the present disclosure will be clarified. Head unit 40 corresponds to a head unit, XY-robot 30 corresponds to a moving device, first and second Z-axis driving devices 70A, 70B correspond to lifting and lowering devices, component supply device 20 corresponds to a component supply device, and control device 80 corresponds to a control device. In addition, nozzle 44 corresponds to a pickup member, and lifting and lowering positions 75 correspond to predetermined positions (first and second positions). Furthermore, engagement piece gripping section 71a corresponds to a pickup member engaging section, valve operation lever 45 corresponds to an operation lever, and lever gripping section 46a corresponds to a lever engaging section.

In the above-described component mounting machine 10, while the operation of rotating head main body 41 and the operation of moving head unit 40 are performed together, nozzle 44 positioned at predetermined lifting and lowering position 75 of head unit 40 picks up the component supplied by component supply device 20 and mounts each component on board S, after the pickup is completed. In addition, at least either at the time of component pickup or at the time of component mounting, it is possible to perform the control such that one or both of the operation of reversing the rotational direction of head main body 41 and the operation of rotating head main body 41 n times the interval (45°), where n is an integer of 2 or more, between the nozzles are performed. Accordingly, it is possible to shorten a time required at the time of the component pickup or at the time of the component mounting, compared to a conventional component mounting machine.

In addition, control device 80 is capable of controlling the first and second Z-axis driving devices 70A, 70B so that nozzles 44, positioned at two lifting and lowering positions 75, simultaneously pick up the components at the time of the component pickup, or capable of selecting any of first and second Z-axis driving devices 70A, 70B so that the movement distance of head unit 40 is shortened at the time of the component mounting. Therefore, it is possible to shorten the time required at the time of component pickup or at the time of the component mounting.

Furthermore, during component pickup, in a case in which there is an advantageous pickup order (see FIG. 11) for which pickup is more efficient than a case in which the nozzles 44 sequentially pick up the components while head main body 41 is rotated by 45° at a time in one direction (see FIG. 12), it is possible to use the advantageous pickup order. In addition, during component mounting, in a case in which there is an advantageous mounting order (see FIGS. 13 and 14) for which mounting is more efficient than a case in which the components held by nozzles 44 are sequentially mounted on board S while head main body 41 is rotated by 45° at a time in one direction (see FIGS. 15 and 16), it is possible to use the advantageous mounting order.

Furthermore, even in a case where engagement piece gripping section 71a of first and second Z-axis driving devices 70A, 70B interferes with a member (for example, engagement piece 42a) mounted on head main body 41 during a forward rotation or a reverse rotation, engagement piece gripping section 71a is capable of rotating in a pushed direction to retract, so that no trouble occurs.

In addition, even in a case where lever gripping section 46a of valve driving devices 46A, 46B interferes with a member (for example, engagement piece 42a) mounted on head main body 41 during the forward rotation or the reverse rotation, lever gripping section 46a is capable of rotating in the pushed direction to retract, so that no trouble occurs.

Note that the present disclosure is not limited to any of the above described embodiments, and it is needless to say that the present disclosure can be implemented in various forms as long as the technology belongs to the technical scope of the present disclosure.

For example, in the above-described embodiment, head main body 41, in which eight nozzles 44 are arranged at the predetermined intervals on the same circumference is given as an example; the number of nozzles 44, however, is not limited to eight, and may be, for example, 4, 12, 20, or 24.

In the above-described embodiment, the first and second Z-axis driving devices 70A, 70B are provided in head unit 40; only one of either first or second Z-axis driving devices 70A, 70B, however, may be provided. In this case, although it is not possible to simultaneously pick up two components or to separately use two Z-axis driving devices, since it is possible to reverse head main body 41 or perform the nozzle skipping, it is possible to shorten the time required at the time of the component pickup or at the time of the component mounting, compared with a conventional component mounting machine.

In order of the component mounting in FIG. 11 of the above-described embodiment, the reversing operation of head main body 41 is performed; the nozzle skipping operation (an operation of rotating head main body 41 by 90° or more), however, may be additionally performed.

In the above-described embodiment, nozzle 44 is given as an example as the pickup member; the present disclosure, however, is not particularly limited to nozzle 44, and any member may be used as long as the member is capable of picking up the component. For example, a finger-shaped chuck may be used to grasp and release the component.

In the above described embodiment, first and second lifting and lowering positions 75 are set to face each other with the center of rotation of head main body 41 interposed therebetween; the present disclosure, however, is not particularly limited this, and any position, in which it is possible to operate two of the multiple circumferentially arranged nozzles 44, may be used.

The component mounting machine of the present disclosure may be configured as follows.

In the component mounting machine of the present disclosure, the predetermined position each may be a first position and a second position positioned on the predetermined circumference, and the lifting and lowering device may include two devices including a first device configured to lift and lower a pickup member positioned in the first position and a second device configured to lift and lower a pickup member positioned in the second position. In doing so, it is possible to control two lifting and lowering devices such that the two pickup members simultaneously pick up the components at the time of the component pickup, or to select any of the lifting and lowering devices such that the movement distance of the head unit is shortened at the time of the component mounting. Therefore, it is possible to shorten the time required at the time of component pickup or at the time of the component mounting.

In the component mounting machine of the present disclosure, the control device may be configured to use the advantageous pickup for component pickup, in a case where the advantageous pickup order, which is more efficient than that of a case where the pickup members sequentially pick up the components while the head main body rotates at the interval at a time in one direction, is available. Alternatively, the control device may be configured to use the advantageous mounting order during component mounting in a case where the advantageous mounting order, which is more efficient than that of a case where the components picked up by the pickup members are sequentially mounted on the board while the head main body rotates at the interval at a time in one direction, is available. At least either during component pickup or during component mounting, it is easy to design such an advantageous pickup order or advantageous mounting order by performing one or both of the operation of reversing the rotational direction of head main body 41 and the operation of rotating head main body 41 n times the interval between the pickup members, where n is an integer of 2 or more. Here, examples of the "advantageous pickup order" include a pickup order capable of shortening the time required for component pickup or for component mounting. Specifically, examples of the pickup order include a pickup order capable of reducing a head rotation angle and a head unit movement distance during component pickup, and a pickup order capable of reducing the head rotation angle and the head unit movement distance during component mounting.

In the component mounting machine of the present disclosure, the lifting and lowering device may have a pickup member engaging section configured to engage with the pickup member positioned at the predetermined position to lift and lower the pickup member, and the pickup member engaging section may rotate and retract in a pushing direction of the member when interfering with a member mounted on the head main body rotating in a forward direction, and may rotate and retract in a pushing direction when interfering with a member mounted on the head main body rotating in a reverse direction. In doing so, even in a case where the pickup member engaging section interferes with the member mounted on the head main body during the forward rotation or the reverse rotation, no trouble occurs.

In the component mounting machine of the present disclosure, the pickup member may be a nozzle configured to perform pickup and release of the component by pressure, the head main body may include an operation lever configured to switch between positive pressure and negative pressure supplied to the nozzle for each pickup member, the head unit may include a lever engaging section configured to engage with and operate the operation lever, independently of the head main body, and the lever engaging section may be configured to rotate and retract in a pushing direction of the member when interfering with a member mounted on the head main body rotating in the forward direction, and may be configured to rotate and retract in a pushing direction of the member when interfering with the member mounted on the head main body rotating in the reverse direction. In doing so, even in a case where the lever engaging section interferes with the member mounted on the head main body during the forward rotation or the reverse rotation, no trouble occurs.

INDUSTRIAL APPLICABILITY

The present disclosure can be applied to various industries that perform an operation of mounting a component on a board.

REFERENCE SIGNS LIST

10 component mounting machine, 20 component supply device, 20a rail member, 20p component supply position, 21 tape, 22 reel, 23 feeder table, 24 slot, 25 board conveyance device, 26 conveyor belt, 27 support pin, 30 XY-robot, 31 X-axis guide rail, 32 X-axis slider, 33 Y-axis guide rail, 34 Y-axis slider, 36 X-axis motor, 37 X-axis position sensor, 38 Y-axis motor, 39 Y-axis position sensor, 40 head unit, 41 head main body, 42 nozzle holder, 42a engagement piece, 42b spring, 44, 441 to 448 nozzle, 45 valve operation lever, 46, 46A, 46B valve driving device, 46a lever gripping section, 47 vertical shaft, 48, 48A, 48B, side camera, 50 R-axis driving device 51 R-axis, 52 R-axis gear 53 gear, 54 R-axis motor, 55 R-axis position sensor, 60 Q-axis driving device, 61, 62 Q-axis gear, 63, 64 gear, 65 Q-axis motor, 66 Q-axis position sensor, 70 Z-axis driving device, 70A first Z-axis driving device, 70B second Z-axis driving device, 71 Z-axis slider, 71a engagement piece gripping section, 71b vertical shaft, 72 ball screw, 73 Z-axis motor, 74 Z-axis position sensor, 75 lifting and lowering position, 80 control device, 81 CPU, 82 ROM, 83 HDD, 84 RAM, 85 input and output interface, 86 bus.

The invention claimed is:

1. A component mounting machine comprising:
   a head unit that includes a head main body configured to hold multiple pickup members, each configured to pick up a component, at a predetermined interval along a predetermined circumference and that is configured to rotate in forward and reverse directions, the head unit being configured to revolve the multiple pickup members by rotating the head main body, the head main body including an operation lever configured to switch between positive pressure and negative pressure supplied to each pickup member, and the head unit including a lever engaging section configured to engage with and operate the operation lever, independently of the head main body;
   a moving device configured to move the head unit;
   a lifting and lowering device that is provided in the head unit independently of the head main body, and the lifting and lowering device being configured to lift and lower a pickup member which is positioned at a predetermined position of the head unit among the multiple pickup members;
   multiple component supply devices, each configured to supply the component to the pickup member that is positioned at the predetermined position; and
   a control device configured to
      control the head main body, the moving device, the lifting and lowering device, and the component supply device in such a way that the pickup members, each being positioned at the predetermined position, pick up respective components supplied by the component supply device, the components each being mounted on a board after completion of the pickup, while performing an operation of rotating the head main body and an operation of moving the head unit together, and
      perform one or both of an operation of reversing a rotational direction of the head main body and an operation of rotating the head main body n times the interval, where n is an integer of two or greater, at least either at a time of component pickup or at a time of component mounting.

2. The component mounting machine according to claim 1,
   wherein the predetermined position is a first position and a second position positioned on the predetermined circumference, and
   wherein the lifting and lowering device includes two devices including a first device configured to lift and lower a pickup member positioned in the first position and a second device configured to lift and lower a pickup member positioned in the second position.

3. The component mounting machine according to claim 1,
wherein the control device is configured to, during component pickup, in a case in which there is an advantageous pickup order for which pickup is more efficient than a case in which the pickup members sequentially pick up the components while the head main body is rotated by a single interval at a time in one direction, use the advantageous pickup order.

4. The component mounting machine according to claim 1,
wherein the control device is configured to, during component mounting, in a case in which there is an advantageous mounting order for which mounting is more efficient than a case in which the components held by the pickup members are sequentially mounted while the head main body is rotated by a single interval at a time in one direction, use the advantageous mounting order.

5. The component mounting machine according to claim 1,
wherein the pickup member is a nozzle configured to perform pickup and release of the component by pressure,
and
wherein the lever engaging section is configured to rotate and retract in a pushing direction of the pickup member when interfering with a member mounted on the head main body rotating in a forward direction, and is configured to rotate and retract in a pushing direction of the member when interfering with a member mounted on the head main body rotating in a reverse direction.

6. The component mounting machine according to claim 1,
wherein the control device is configured to perform both the operation of reversing a rotational direction of the head main body and the operation of rotating the head main body n times the interval.

7. The component mounting machine according to claim 1,
wherein the control device is configured to perform the operation of reversing a rotational direction of the head main body.

8. The component mounting machine according to claim 1,
wherein the control device is configured to perform the operation of rotating the head main body n times the interval.

9. A component mounting machine comprising:
a head unit that has a head main body configured to hold multiple pickup members, each configured to pick up a component, at a predetermined interval along a predetermined circumference and that is configured to rotate in forward and reverse directions, the head unit being configured to revolve the multiple pickup members by rotating the head main body;
a moving device configured to move the head unit;
a lifting and lowering device that is provided in the head unit independently of the head main body, and the lifting and lowering device being configured to lift and lower a pickup member which is positioned at a predetermined position of the head unit among the multiple pickup members;
multiple component supply devices, each configured to supply the component to the pickup member that is positioned at the predetermined position; and
a control device configured to
control the head main body, the moving device, the lifting and lowering device, and the component supply device in such a way that the pickup members, each being positioned at the predetermined position, pick up respective components supplied by the component supply device, the components each being mounted on a board after completion of the pickup, while performing an operation of rotating the head main body and an operation of moving the head unit together, and
perform one or both of an operation of reversing a rotational direction of the head main body and an operation of rotating the head main body n times the interval, where n is an integer of two or greater, at least either at a time of component pickup or at a time of component mounting,
wherein the lifting and lowering device has a pickup member engaging section configured to engage with the pickup member positioned at the predetermined position to lift and lower the pickup member, and
wherein the pickup member engaging section is configured to rotate and retract in a pushing direction of the pickup member when interfering with a member mounted on the head main body rotating in a forward direction, and is configured to rotate and retract in a pushing direction of the member when interfering with a member mounted on the head main body rotating in a reverse direction.

* * * * *